(12) United States Patent
Miao

(10) Patent No.: US 10,073,123 B1
(45) Date of Patent: Sep. 11, 2018

(54) HIGH-SPEED, LOW DRIFT, PRECISION PEAK DETECTION CIRCUIT AND SYSTEMS

(71) Applicant: Marvell International Ltd., Hamilton (BM)

(72) Inventor: Xiao Yu Miao, Singapore (SG)

(73) Assignee: Marvell International Ltd., Hamilton (BM)

( * ) Notice: Subject to any disclaimer, the term of this patent is extended or adjusted under 35 U.S.C. 154(b) by 148 days.

(21) Appl. No.: 15/335,093

(22) Filed: Oct. 26, 2016

Related U.S. Application Data

(60) Provisional application No. 62/246,243, filed on Oct. 26, 2015.

(51) Int. Cl.
| | |
|---|---|
| *G11B 5/02* | (2006.01) |
| *G11B 21/02* | (2006.01) |
| *G01R 21/01* | (2006.01) |
| *G01R 33/12* | (2006.01) |
| *G11B 5/60* | (2006.01) |
| *G11B 20/18* | (2006.01) |

(52) U.S. Cl.
CPC ......... *G01R 21/01* (2013.01); *G01R 33/1207* (2013.01); *G11B 5/6017* (2013.01); *G11B 20/1816* (2013.01)

(58) Field of Classification Search
CPC . G11B 20/10009; G11B 5/09; G11B 2220/90; G11B 5/02; G11B 5/6005; G11B 5/59633; G11B 5/54
USPC ......................................... 360/39, 46, 67, 75
See application file for complete search history.

(56) References Cited

U.S. PATENT DOCUMENTS 7,298,567 B2 * 11/2007 Poss .................... G05F 1/575
360/46

* cited by examiner

*Primary Examiner* — Nabil Hindi

(57) ABSTRACT

Systems and techniques relating to voltage signal peak level detection used in sensor devices, namely in Fly-Height Sensors (FHS) devices include, according to an aspect, an integrated chip device comprising: peak detection circuitry configured to receive a voltage signal and output a peak voltage signal associated with a peak voltage level of the voltage signal, wherein the peak detection circuitry comprises: a linear loop section configured to store the peak voltage level and hold additional voltage levels of the voltage signal at an output terminal of an amplifier to a value greater than zero; and a feedback loop section configured to reduce a leakage current within the peak detection circuitry and generate a guard voltage signal usable to reduce a feedback voltage and prevent the feedback voltage from successively re-entering into the feedback loop section.

22 Claims, 5 Drawing Sheets

HIGH-SPEED, LOW DRIFT, PRECISION PEAK DETECTION CIRCUIT AND SYSTEMS

CROSS-REFERENCE TO RELATED APPLICATIONS

This disclosure claims priority to U.S. Provisional Application Ser. No. 62/246,243, filed on Oct. 26, 2015, the disclosure of which is incorporated herein by reference in its entirety.

BACKGROUND

This disclosure relates to voltage signal peak level detection used in sensor devices, namely in Fly-Height Sensors (FHS) devices, and circuitry used therein.

Hard Disk Drives (HDD) are ubiquitous in the computing environment. Existing HDD systems employ magnetic-medium-based storage devices, and the data is typically stored on circular, concentric tracks on magnetic disk surfaces. A read-write head retrieves and records data on the magnetic layer of a rotating disk as it flies over the disk surface without contacting the disk surface. When retrieving data, magnetic field variations are converted into an analog electrical signal, the analog signal typically is amplified, converted to a digital signal and interpreted. To guarantee the quality of the information saved on and read back from the disk, and to prevent damage of the head with disks spinning at high speeds, the read-write head should be accurately distanced from the disk. FHS devices are typically employed to detect the fly-height distance of the head from the disk during operation of the disk drives. Existing FHS systems utilize peak detection techniques in order to detect changes in sensor signal strength which are correlated to a distance of the sensor from the disk, for example. Inasmuch as accurate positioning of the sensor from the disk is necessary to guarantee the quality of information stored and read back from a disk, the accuracy of peak detection thus is essential to the function of the FHS devices. Design tradeoffs between speed, accuracy, and linearity of typical peak detection circuitry can limit the performance of some FHS devices.

SUMMARY

The present disclosure describes voltage signal peak level detection techniques used in sensor devices, namely in Fly-Height Sensors (FHS) devices, and circuitry used therein. The systems and techniques described herein can facilitate the implementation of a high-speed, low drift, and precise peak detection circuitry used in sensor devices.

According to an aspect of the described systems and techniques, an integrated circuit device includes: peak detection circuitry configured to receive a voltage signal and output a peak voltage signal associated with a peak voltage level of the voltage signal, wherein the peak detection circuitry comprises: a linear loop section configured to store the peak voltage level and hold additional voltage levels of the voltage signal at an output terminal of an amplifier to a value greater than zero; and a feedback loop section configured to reduce a leakage current within the peak detection circuitry and generate a guard voltage signal usable to reduce a feedback voltage and prevent the feedback voltage from successively re-entering into the feedback loop section.

According to another aspect of the described systems and techniques, a hard disk drive (HDD) system includes: a disk; a read/write head; and an integrated circuit device, wherein the integrated circuit device comprises sensor circuitry, signal analysis circuitry, and peak detection circuitry providing (i) a receiving path coupling the sensor circuitry to the peak detection circuitry and usable to receive a voltage signal generated by the sensor circuitry in response to movement of the disk and the read/write head, and (ii) an output path coupling the peak detection circuitry to the signal analysis circuitry and usable to output an output signal indicating a peak voltage level of the voltage signal to the signal analysis circuitry; wherein the receiving path is configured to hold additional voltage levels of the voltage signal at an output terminal of an amplifier to a value greater than zero, reduce a leakage current within the peak detection circuitry, and generate a guard voltage signal usable to reduce a feedback voltage and prevent the feedback voltage from successively re-entering into the receiving path.

According to another aspect of the described systems and techniques, a method includes: receiving an input voltage signal at an in input terminal of a first amplifier, wherein the first amplifier is coupled to a receiving path including (i) a transistor, (ii) a first diode, (iii) a second diode, (ix) a first resistor, (v) a second resistor, (vi) a loop line, and (vii) a feedback line; propagating a first voltage signal along the receiving path from an output terminal of the first amplifier to a terminal of a capacitor and returning the first voltage signal to an additional input terminal of the first amplifier, wherein the receiving path is enabled based on the first voltage signal applying a forward bias voltage across the first diode and the second diode and the propagating the first voltage signal comprises holding a peak voltage level associated with the input voltage signal at the capacitor and propagating the first voltage signal via a loop line coupling the capacitor, the transistor, the first diode, the second diode, and the first amplifier in a loop configuration and holding additional voltage levels associated with the input voltage signal at the output terminal of the first amplifier to a value greater than zero; propagating a second voltage signal along the receiving path from an output terminal of the second diode to an input terminal of the second amplifier; propagating a third voltage signal along the receiving path from an output terminal of the second amplifier to an input terminal of a first resistor and returning the third voltage signal to an input terminal of the second diode via the feedback line, wherein the propagating the third voltage signal comprises propagating across the first resistor and reducing a voltage level of the third voltage signal such that a feedback voltage level at an input terminal of the second diode is less than a voltage level of the second voltage signal; and outputting a fourth voltage signal from an output terminal of the second amplifier to be received by an output path, wherein the fourth voltage signal is a portion of the third voltage signal and is associated with the peak voltage level.

Embodiments of systems and techniques that are described herein have resulted in one or more of the following advantages. For instance, implementations of the described peak detection circuitry improve the speed-power efficiency of the circuit in comparison to conventional peak detection circuitry. Also, the peak detection circuitry as described herein reduces voltage drift caused by amplifier input offset and diode leakage, and thereby increases precision of the circuitry. Integration of the peak detection circuitry described herein into some sensor devices improves the accuracy of sensory responses. As such, peak detection circuitry described herein employs a configuration that improves the accuracy of the peak level output of the circuitry. Moreover, implementing the peak detection circuitry described herein improves the response time, or recovery time, of the circuitry, which in embodiments improves performance in the peak detection of higher frequency signals. Moreover, the peak detection circuitry implements a configuration usable to achieve low leakage current, thereby increasing an amount of time the detected peak information is held by the circuit.

BRIEF DESCRIPTION OF THE DRAWINGS

Like reference symbols in the various drawings indicate like elements.

Certain illustrative aspects of the disclosed technologies are described herein in connection with the following description and the accompanying figures. These aspects are, however, indicative of but a few of the various ways in which the principles of the disclosed technologies may be employed and the disclosed technologies are intended to include all such aspects and their equivalents. Other advantages and novel features of the disclosed technologies may become apparent from the following detailed description when considered in conjunction with the figures.

DETAILED DESCRIPTION

The systems and techniques described herein can be implemented as one or more devices, such as one or more integrated circuit (IC) devices, in a storage device. For example, they can be implemented in a read/write channel transceiver device suitable for use in a magnetic recording system.

Figure 1:
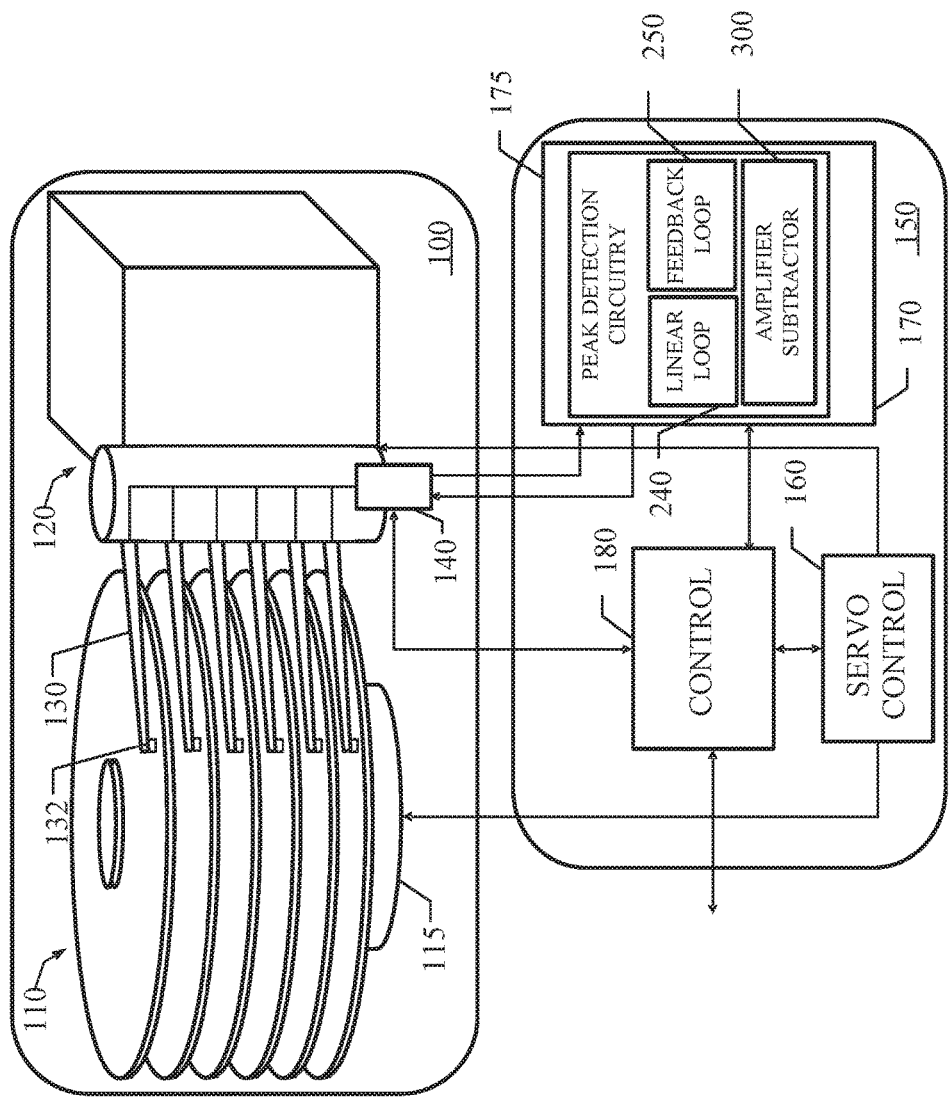
FIG. 1 shows an example of hard disk drive (HDD) architecture including peak detection circuitry, in accordance with an embodiment.

FIG. 1 is a block diagram showing an example HDD, or magnetic-media disk drive including peak detection circuitry 175 as described herein. As shown in FIG. 1, the disk drive includes a head-disk assembly (HDA) 100 and drive electronics 150 (e.g., a printed circuit board assembly (PCBA) with semiconductor devices). The HDA 100 includes one or more disks 110 mounted on an integrated spindle and motor assembly 115. The spindle and motor assembly 115 rotates the disk(s) 110 under read/write head(s) connected with a head assembly 120 in the HDA 100. The disk(s) 110 are coated with a magnetically hard material (e.g., a particulate surface or a thin-film surface) and can be written to, or read from, a single side or both sides of each disk.

A head 132 on an arm 130 is positioned as needed to read data on the disk 110. A motor, such as a voice coil motor (VCM), is used to position the head 132 over a desired track. The arm 130 is a pivoting or sliding arm that is spring-loaded to maintain a proper flying height for the head 132 in any drive orientation. In some embodiments, a closed-loop head positioning system is used. The peak detection circuitry 175 is shown to include multiple portions operating to perform functions of the circuit according to the embodiments, namely the linear loop section 240, feedback loop section 250, and amplifier subtractor section 300.

The HDA 100 includes a preamp/writer 140, in an embodiment, where head selection and sense current value(s) are set. The preamp/writer 140 amplifies a read signal before outputting it to HDA signal processing device 170. In some implementations, the HDA signal processing device 170 includes a read signal circuit, a servo signal processing circuit, and a write signal circuit. The HDA signal processing device 170 is implemented on one or more integrated circuit (IC) devices, in an embodiment.

Also, the HDA signal processing device 170 is configured to perform additional signal analysis capabilities, in an embodiment. In the example of a disk drive illustrated in FIG. 1, the HDA signal processing device 170 operates as a sensor used for measuring, or otherwise determining, characteristics related to operation of the HDA 100 and further includes the peak detection circuitry 175 of the embodiments. In some implementations, the HDA signal processing device 170 is a sensor that is integrated into electronics of the hard disk drive system including, but not limited to, an Embedded Contact Sensor (ECS) or a FHS. The flying height is a measurable characteristic related to the spacing between the head 132 and a disk 110, for instance while performing read/write maneuvers. In an embodiment, some deviations from a predetermined flying height adversely impact on the performance of the hard disk drive system (e.g., increased error rate). During operation of a disk drive, the fly-height varies as a result of changes in environmental temperatures within the drive, or as a result of different orientations used during read or write operations. In an example, because of environmental temperature changes, components of the disk drive can heat-up (for instance due to an increased duty cycle), and the higher temperature can cause physical deformation of some components. Consequently, if left uncompensated, the head 132 may protrude closer to an associated disk 110. As such, thermal deformation can cause flying height variations between reading operations and writing operations, respectively, and possible read or write errors. Accordingly, HDA signal processing device 170 implements a fly-height sensor to measure, and subsequently control, parameters associated with fly-height spacing concerns, such as the mechanical fly-height distance of the head 132 over the disk 110 (e.g., as a result of mechanical movement of the arm 130), and the physical distance that the head 132 further protrudes towards a surface of disk 110 (e.g., closeness of the head and disk as compared to an initial position at a nominal temperature).

In reference to FIG. 1, the HDA signal processing device 170 is employed to determine whether a head 132 is operating at a fly-height distance from a disk 110 that has been deemed appropriate or desirable. An operational fly-height range is employable to enable the disk drive to maintain a flying height within a range of acceptable distances for effectively performing reading and/or writing of data in the drive (e.g., below a particular error rate). The HDA signal processing device 170 receives a signal generated by a head 132 as input, and further conveys the signal as input to the peak detection circuitry 175. Thereafter, the peak detection circuitry 175 detects a peak voltage of a read signal, for instance, which the HDA signal processing device 170 further uses to determine an associated flying height for a head 132. For instance, an output signal generated by the peak detection circuitry 175 is translated to a DC signal and used to analyze how close the sensor is to the disk 110. In an embodiment, the HDA signal processing device 170 uses the peak voltage output from the peak detection circuitry 175 as a comparative value that is measured against one or more threshold values corresponding to the same portion of the disk 110 being accessed during the measurement, where the threshold values can be predetermined voltages that indicate a minimum and/or maximum flying height linked to acceptable performance metrics of the disk drive. Based on the comparison using the detected peak voltage, HDA signal processing device 170 establishes whether the measured fly-height has exceeded a maximum threshold, or conversely has fallen below a minimum threshold, and thereby indicates that there is a potential error in the read/write of data on the accessed area of the disk. In some implementations, the HDA signal processing device 170 generates signals that are communicated to the control circuitry 180, causing the disk drive to perform controlling or corrective actions (e.g., rewrite to the accessed portion of a disk, readjust the head positioning) in the event that an operational fly-height is determined to be outside of the acceptable range.

In accordance with the example, the head 132 also includes some of the sensor components of the FHS, such as a resistor element (e.g., used to generate heat to cause thermal expansion of the magnetic head), communicating with the sensor components residing within the HDA signal processing device 170. In some implementations, sensor components are positioned at the trailing end of the head 132, so as the head flies over, or comes into contact with, the disk 110, the resistance value changes due to frictional induced heat at the head-disk boundary. The fly-height distance between the head 131 and the disk 110 is detected by the sensor components in the HDA signal processing device 170 receiving this measured change in resistance, or the associated change in voltage, that is experienced as a result of the thermal fluctuations at the head 132 (e.g., change in magnetic spacing can be calculated from analyzing signals from the read-write head).

Signals between the HDA 100 and the drive electronics 150 are carried through a flexible printed cable, for example. A controller 180 directs a servo controller 160 to control mechanical operations, such as head positioning through the head assembly 120 and rotational speed control through the motor assembly 115. The controller 180 is disposed on one or more IC chips (e.g., a combo chip), in an embodiment, which include read/write channel signal processing circuitry. In some implementations, the controller 180 is implemented as a controller circuit providing an interface to the HDA, such as a hard disk controller. The drive electronics 150 also include various interfaces, such as a host-bus interface, and memory devices, such as a read only memory (ROM) for use by a microprocessor, and a random access memory (RAM) for use by a hard disk controller. Additionally, the read/write channel includes error correction circuitry, according to some implementations.

Figure 2A:
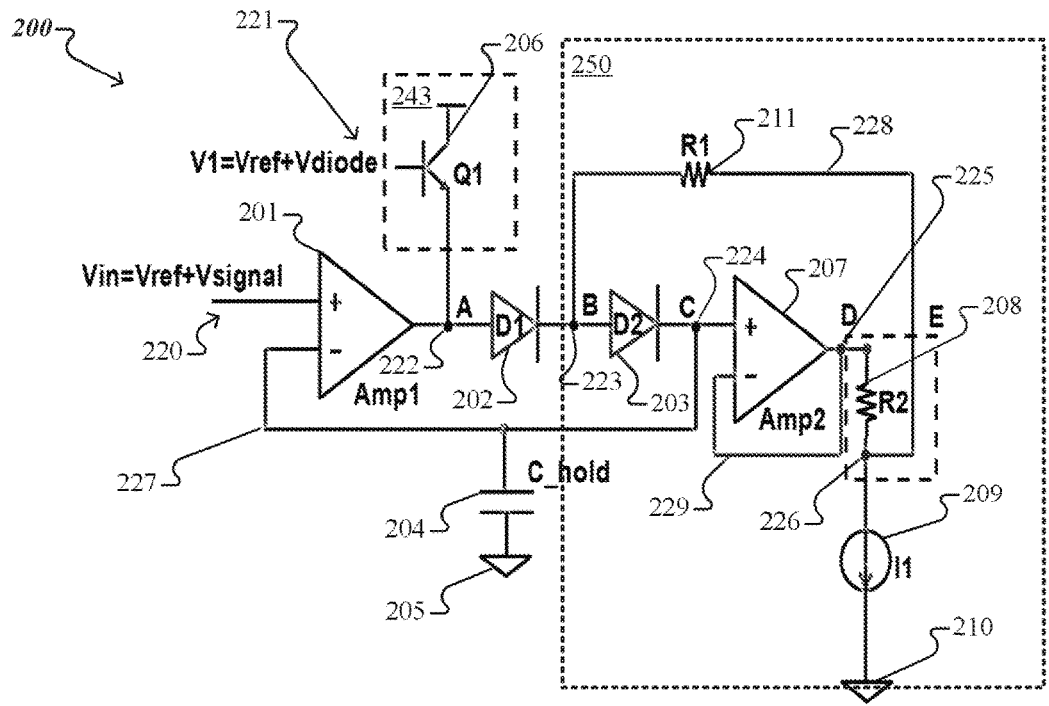
FIGS. 2A-2B show examples of circuit configurations for a section of peak detection circuitry as implemented in a HDD architecture, such as the HDD architecture of FIG. 1.
Figure 2B:
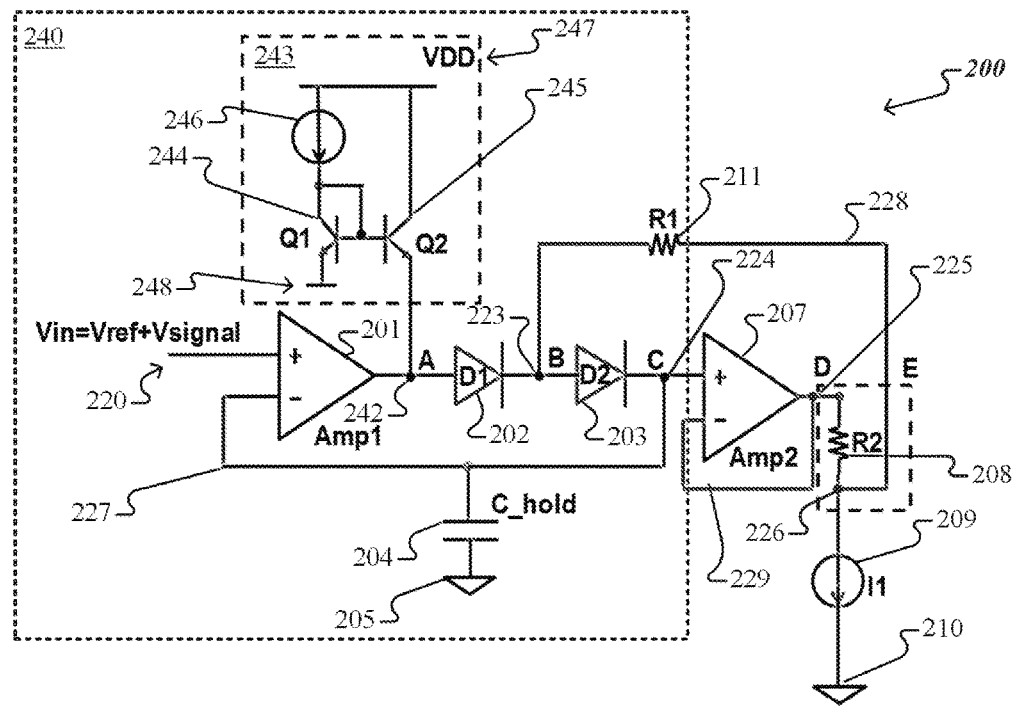

FIGS. 2A-2B are examples of circuit configurations for a first stage of the peak detection circuitry 200 that is integrable within various devices to implement peak voltage level detection functions. For instance, peak detection circuitry 200 is usable for several electro-mechanical applications in which it is desirable to determine that the maximum voltage of a signal remains within an operational range (e.g., preventing amplifier saturation), such as devices including infrared receivers and the HDD as shown in FIG. 1. The first stage of the peak detection circuitry 200 is configured for detecting signal level peaks by monitoring an input voltage signal of interest to hold, and subsequently output, the signal's maximum value, or peak. FIG. 2B illustrates that the circuitry includes a linear loop portion 240, employing a loop line 227 coupling circuit components (shown inside box 240) in a liner loop configuration.

The linear loop 240, as shown in FIG. 2B, includes amplifier $Amp_1$ 201, diode $D_1$ 202, and diode $D_2$ 203, which are respectively connected in series. Loop line 227 is implemented as a circuit connection, wire, or conductor suitable for transmission of signals. The loop line 227 has an end that is connected to an input terminal (−) of amplifier $Amp_1$ 201 and an opposite, or opposing, end connected to an output terminal of diode $D_2$ 203 at node C 224. As shown, the linear loop 240 incorporates node A 222 and node C 224, which are points along the loop where terminals of two or more components are coupled together. For instance, as shown in FIG. 2A, node A 222 is employed for coupling together the output terminal of $Amp_1$ 201, an emitter terminal of transistor $Q_1$ 206, and an input terminal of diode $D_1$ 202. For discussion purposes, a circuitry section 243 of the peak detection circuitry 200 is referred to as a transistor loop including a configuration of one or more transistors, such as transistor $Q_1$ 206. In some instances, transistor loop 243, including function of Q1 206, provides capabilities within operation of the circuit that improves the overall function of the peak detection circuitry 200, such as a limiting of the voltage swing at node to increase detection speed. Additionally, node C 224 couples together an output terminal of $D_2$ 203, the input terminal of capacitor $C_{hold}$ 204, and further serves as a connection point used for coupling the linear loop 240 portion (shown in FIG. 2B) and the feedback loop 250 portion (shown in FIG. 2A) of the peak detection circuitry 200 (i.e., output terminal of $D_2$ 203 connected to input terminal of $Amp_2$ 207). The linear loop 240 is configured to feed a portion of the voltage output from $D_2$ 203 (e.g., detected peak of voltage signal) back to $Amp_1$ 201 to be received as input, where linearity for the loop may be achieved by selecting an appropriate value for a bias voltage applied as input to $Amp_1$ 201. Capacitor $C_{hold}$ 204 is also coupled to the linear loop line 227, between node C 224 and ground 205.

In some currently employed contact sensor systems, a more basic single diode configuration is used for the peak detection circuit. For instance, the circuitry includes one diode connected to a capacitor. However, existing peak detection circuits may experience drawbacks associated with this single diode implementation. For instance, a peak detector circuit using a single diode can encounter diode voltage drop, where the voltage signal across the diode is inconsistently lowered, or decreased, due to fluctuations in temperature within the circuit. A detected peak voltage that is captured and held by the capacitor becomes susceptible to inaccuracies, as the signal intended to be measured (e.g., from a disk head) is compromised by diode voltage drop. Thus, the configurations shown in FIGS. 2A-2B using diodes 202, 203 realizes a solution for the limitations associated with single diode limitations, and improves accuracy of the peak detection circuitry 200 (i.e., more precise peak value is stored by capacitor $C_{hold}$ 204). According to the implementation, amplifier 207 serves as a unity-gain buffer, which maintains the voltage of node B 223 close to a voltage at node C 224. Introduction of diode 204 into operation of the circuitry effectuates the reversed voltage across diode D2 to consistently retain a fixed small value, without being substantially affected by a large amplitude of a voltage captured at node C 224. In such condition, the current leakage due to diode D2 203 will be minimized and considerably removed from the detected signal.

According to the implementation shown in FIG. 2A, an input voltage signal $V_{in}$ 220 is initially received by the components of the peak detection circuitry 200 at an input terminal of $Amp_1$ 201. As illustrated in FIG. 2A, $V_{in}$ 220 is the sum of a direct current (DC) bias voltage $V_{ref}$ added to a voltage signal $V_{signal}$ that is associated with a signal of interest for monitoring and/or detection. A design tradeoff between speed, accuracy, and linearity of the peak detection circuitry 200 can be made by selecting an appropriate value for $V_{ref}$. In some instances, $V_{REF}$ is chosen to be ~1V. For instance, in order to detect for a large fast rising $V_{in}$ signal, the voltage source should be large to appropriately charge $C_{hold}$ 204. As an example, $V_{signal}$ is an analog voltage signal generated by a head of a disk drive and captured by sensor circuitry to determine fly-height information as discussed in reference to FIG. 1. The amplifier $Amp_1$ 210, when outputting a large voltage, applies a forward bias to diodes 202, 203 permitting signal flow to charge the capacitor $C_{hold}$ 204. Thus, the capacitor Choir 204 receives the charge from the input signal Vie, from traversing the diodes 202, 203 and is represented as input for the capacitor as the voltage present at node C 224. Thereafter, as the voltage of $V_{in}$ 220 increases, similarly the voltage of node C 224 increases, and $C_{hold}$ 204, in turn, is further charged to hold the value of the higher voltage. The diodes 202, 203 prevent $C_{hold}$ 204 from discharging, and cause the capacitor to continue to retain the highest value of $V_{in}$ 220. If the voltage of $V_{in}$ 220 drops below the value currently held by $C_{hold}$ 204, during the charging period, the voltage on $C_{hold}$ 204 remains at the higher value. That is, when $V_{in}$ 220 decreases from a previously higher voltage, $Amp_1$ 201 correspondingly lowers the voltage at node A 222, which reverse biases the diodes 202, 203. As a result, D2 203 is turned off, and the $C_{hold}$ 204 will continue to hold the current, and higher, voltage value. The capacitor, $C_{hold}$ 204, is charged for a period of time until a voltage at node C 224 (i.e., $V_c$) which is the input voltage of $Amp_2$ 207, is equal to the input voltage $V_{in}$ 220 (i.e., $V_c=V_{in}$). Accordingly, $C_{hold}$ 204 functions to retain the highest voltage value produced by the signal for the duration of the charging period. At the end of the charging period and prior to resetting the circuit, $C_{hold}$ 204 stores the maximum voltage captured from monitoring $V_{in}$ 220, and thereby has detected the peak value of the signal. $Amp_1$ 201, operating in concert with capacitor $C_{hold}$ 204, conveys the detected peak value associated with $V_{in}$ 220 as input to a second amplifier $Amp_2$ 207.

The performance of some existing peak detection circuits experience limitations such as slow response, or low recovery speed, due to various component characteristics. As an example, during discharge of a capacitor, a diode of the detection circuit is "off" or otherwise prohibiting signal flow (e.g., when the voltage is negative), and the circuitry path used to implement detection for a next peak of the signal is broken. To enable a faster response of the peak detection circuitry 200 as described herein, the voltage present at node A 222 (i.e., $V_A$) cannot be pulled down to a zero value after detecting a peak value, which requires resetting the circuit in order to perform capture-and-hold for subsequent peak levels. For instance, when $V_A$ is discharged in relation to a previously detected peak for the monitored signal, $Q_1$ 206 functions to prevent the voltage from dropping to zero (e.g., completely discharging). Rather the transistor allows some voltage at node A 222 to be held, and further maintains this $V_A$ at a value that is close to the bias voltage $V_{ref}$. As an example, until $V_C$ is equal to $V_{in}$, the transistor Q1 206 functions as an off switch, causing the capacitor $C_{hold}$ 204 to retain the voltage $V_{peak}$ until it is reset or a greater peak occurs. Since $V_A$ is not discharged to an extremely low, or zero, voltage, when the next peak of the monitored signal is transmitted to the circuitry, node A 222 does not need to be re-charged by $Amp_1$ 201 to reset the detected level. Thus, a set-up time for the circuit associated with re-charging node A 222 in preparing the circuit for detecting a next peak voltage is eliminated, and thereby increases the detection speed of the peak detection circuitry 200. The transistor $Q_1$ 206 receives a voltage $V_1$ 221 at the base terminal, where $V_1$ 221 is the sum of the reference voltage $V_{ref}$ and a voltage of a diode $V_{diode}$. As an example, in an instance where $V_1$ 221 is large, $D_1$ 202 will be "on" and charge $C_{hold}$ 204 to a value that may be inaccurate. Conversely, in an instance where $V_1$ is extremely low, an output of $Amp_1$ 201 will be out of a saturation region and can adversely affect the operation of Amp1 201. In the event that the output of Amp1 201 goes out of an operation range deemed appropriate, the speed of Amp1 201 will be limited and the element may not able to capture the next peak properly. Thus, as illustrated in FIG. 2A, having a suitable value for $V_1$ (i.e., setting $V_1=V_{ref}+V_{diode}$) will keep the voltage at node A 222 close to around Ver when the input does not have a higher voltage than the captured peak value. In such a condition, a reverse voltage of $D_1$ 202 will be the peak value and the voltage of the output of Amp1 201 will be within the operation region. The peak detection circuitry 200 implementation employing transistors, as illustrated in FIGS. 2A-2B, provides a solution realizing a faster recovery of the circuitry between detected peak signal levels.

FIG. 2B shows an example of circuit configuration for a first stage of the peak detection circuitry 200 including a transistor loop 243, as opposed to the single transistor configuration illustrated in FIG. 2A. The transistor loop 243 employs two transistors $Q_1$ 244 and $Q_2$ 245 in the linear loop 240 portion of the circuitry. In particular, a base terminal of transistor $Q_1$ 244 is connected to a base terminal of transistor $Q_2$ 245. A positive supply voltage VDD 247 is connected to the collector terminal of the transistor $Q_2$ 245. Moreover, a current source 246 is coupled to VDD 247 and the collector terminal of $Q_1$ 244. The emitter terminal of transistor $Q_1$ is further coupled to a supply voltage $V_{ref}$ 248. In accordance with this configuration, node A 242 is employed for coupling together the output terminal of $Amp_1$ 201 and an input terminal of diode $D_1$ 202 with the transistor loop 243. The remaining elements of peak detection circuitry 200 shown in FIG. 2B are also included using like reference symbols in FIG. 2A. Accordingly, these elements are discussed in reference to FIG. 2A. As shown in FIGS. 2A-2B, the transistors are implemented as bipolar junction transistors (BJTs). In some implementations, the transistors are implemented as Complementary Metal-Oxide-Semiconductor (CMOS) transistors.

Figure 2C:
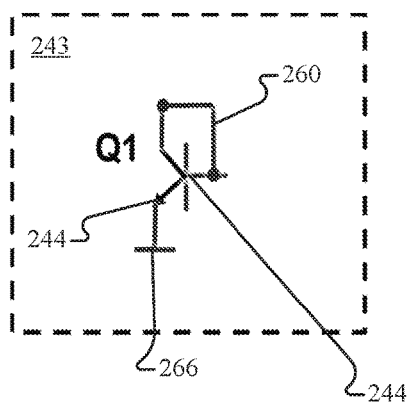
FIGS. 2C-2E show other examples for a section of the of the peak detection circuitry as implemented in a HDD architecture, such as the HDD architecture of FIG. 1.
Figure 2D:
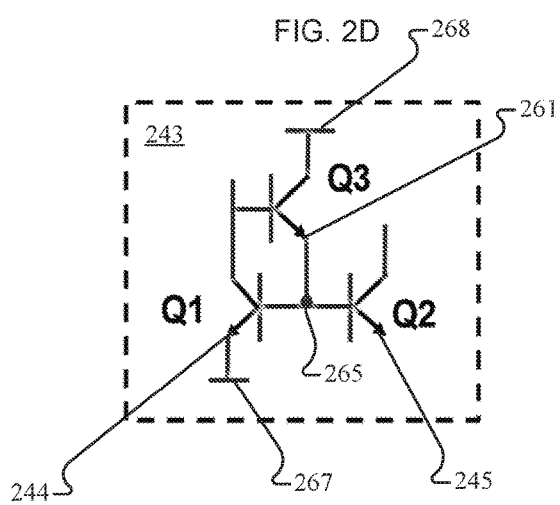
Figure 2E:
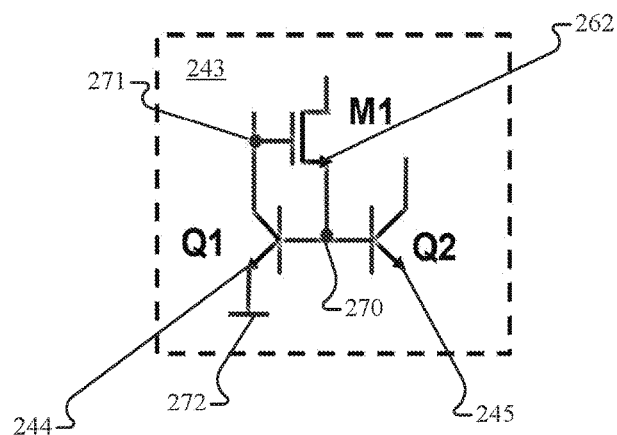

FIGS. 2C-2E shows other examples of the circuitry portion 243, namely the transistor loop. According to the embodiments, each transistor loop 243 implementation shown in FIGS. 2C-2E is included in the linear loop 240 portion of the circuitry (shown in FIG. 2B). FIG. 2C illustrates the transistor loop 243 in accordance with an embodiment employing a single transistor Q1 244. In particular, the base terminal of transistor $Q_1$ 244 is connected to the collector terminal of the transistor, and forming a loop by using line 260. The emitter terminal of Q1 244 is also shown as being connected to voltage source, such as an emitter supply voltage. FIG. 2D shows an alternative configuration for transistor loop 243 in accordance with an embodiment that includes multiple transistors $Q_1$ 244, $Q_2$ 245, and $Q_3$ 261. As illustrated, the configuration includes node 265 coupling together the base terminal of $Q_1$ 244, base terminal of $Q_2$ 245, and the emitter terminal of $Q_3$ 261. Also, the collector terminal of $Q_1$ 244 is connected to the base terminal of $Q_3$ 261. Voltage supplies 267 and 268 and are coupled to the emitter terminal of $Q_1$ 244 and the collector terminal of Q3 261, respectively.

FIG. 2E shows a transistor loop 243 configuration in accordance with an embodiment that incorporates a metal oxide semiconductor field-effect transistor (MOSFET). In accordance with this configuration, node 270 is employed for coupling together the base terminals of $Q_1$ 244 and $Q_2$ 245, and the source terminal of transistor $M_1$ 262. Additionally, node 271 couples together the gate terminal of transistor $M_1$ 262 and the collector terminal of $Q_1$ 244. FIG. 2D also illustrates a voltage supply 272 that is coupled to the emitter terminal of $Q_1$ 244.

Incorporating two diodes 202, 203 into the peak detection circuitry 200 improves accuracy in some embodiments, however certain aspects the diodes' function can introduce a leakage current into the circuitry. For example, a reverse biased voltage experienced across diode $D_1$ 202 resultantly causes the voltage at node C 224 to be lower than the voltage present at node B 223. This inconsistency between the voltages at various nodes along the signal path introduces a difference between the captured and held values associated with the monitored signal and cause loss of information in the circuit (e.g., leakage experienced at the capacitor). The leakage current attributed to the diodes 202, 203 are small in some instances. In some instances, the leakage current of $D_1$ 202 depends on a voltage peak value, having a maximum approximately near the hundreds of pico-amperes. Also, in some cases, the leakage current of $D_2$ 203 is small, for example around few pico-amperes. Nonetheless, for the peak detection circuitry 200 to achieve improved accuracy, it is desirable for the leakage current to be reduced, or substantially eliminated. Therefore, to address current leakage concerns, a feedback loop 250 portion (shown in FIG. 2A) of the peak detection circuitry 200 is utilized in the configuration shown in FIGS. 2A-2B. The peak detection circuitry 200 is configured to employ the feedback loop 250 components (207, 211) to reduce diode leakage current by minimizing voltage drift and maintaining a consistency between the voltages present at node B 223 and node C 224 (e.g., keeping $V_B$ near $V_c$). Moreover, by achieving a low leakage current, the amount of time the detected peak information is held by the circuit can be extended (e.g., Vpk drops <1 mV/mS).

Referring back to FIG. 2A, a feedback loop 250 includes a feedback line 228 that couples an output terminal of amplifier $Amp_2$ 207 and a resistor $R_1$ 211 to the input terminal of diode $D_2$ 203 in a feedback loop 250 configuration. As illustrated in FIGS. 2A-2B, the feedback line 228 has an end coupled to node D 225 and an opposite end connecting to node B 223. Further included in the feedback loop 250 portion of circuitry 200, as illustrated in FIG. 2A, is a resistor $R_2$ 208, that is coupled between node D 225 and a current source $I_1$ 209. As shown in FIG. 2A, current source $I_1$ 209 is also connected to ground 210. Node D 225 is a point along the feedback loop 250 coupling together an output terminal of the $Amp_2$ 207, $R_2$ 208, and a line 229 connecting the output terminal to an input terminal (−) of the $Amp_2$ 207. Additionally, the output terminal of $D_2$ 203 is coupled to the input terminal (+) of $Amp_2$ 207 at node C 224.

The feedback line 228 is employed to feed the buffered voltage output from $Amp_2$ 207, via the line, and return the voltage signal to node B 223. Feeding voltage from an amplified output back to node B 223 increases the voltage present at node B 223, and drives it closer to the voltage at node C 224 so that the leakage current due to $D_2$ 203 is minimized. The resistor $R_1$ 211 controls the output voltage of $Amp_2$ 207, in a manner such that the difference between voltages along points of the feedback loop 250 are reduced to approach being negligible (e.g., voltage at node B 223 equal to voltage at node C 224), and similarly substantially removes current leakage.

Incorporating the additional amplifier $Amp_2$ 207 into the peak detection circuitry 200 also introduces a voltage input offset (i.e., $V_{off\_Amp2}$) into the feedback loop 250 portion of the circuitry. The insertion of $V_{off\_Amp2}$ into the circuitry creates the potential for an unstable loop condition, namely a continuous positive loop. For example, when a positive voltage is returned as feedback input into the feedback loop 250 at node B 223 (e.g., positive feedback produced from a large $V_{off\_Amp2}$), the positive voltage signal also charges node C 224. Consequently, as $V_C$ increases, the signal is further amplified by $AMP_2$ 207, and subsequently fed back to node B 223 as new input into the loop, via feedback line 228. This scenario involving $V_{off\_Amp2}$ effectively creates a positive loop condition in feedback loop 250, where $V_C$ and $V_B$ are constantly increased, causing the circuit to approach an unstable and undesirable status. Therefore, the peak detection circuitry 200 implements a voltage offset (i.e., $V_{off}$) to counteract the effects of $V_{off\_Amp2}$ and maintain stability in the feedback loop 250.

As shown in FIGS. 2A-2B, resistor $R_2$ 208 and a current source $I_1$ 209 are coupled to feedback line 228, which creates a $V_{off}$ in the circuitry as a voltage guarding against loop instability. $V_{off\_Amp2}$ is a random voltage input that is transmitted to the input terminal of the $Amp_2$ 207, via line 229. Although $V_{off\_Amp2}$ has randomized aspects, the voltage value is random within a range, for example 10 mV to 14 mV. In an implementation, the offset voltage is a design trade off with the input device size (e.g., amplifiers). In some instances, as smaller components are employed, a higher offset voltage will be present in the circuitry. For example, 14 mV is calculated for 3δ mismatch variation of the input devices. In order to avoid a positive voltage feedback from successively re-entering into the feedback loop 250 (shown in FIG. 2A) as caused by $V_{in\_Amp2}$, the generated $V_{off}$ is produced at volts greater than the voltage input offset conveyed to the input terminal of $Amp_2$ 207. In operation, the voltage level output from $Amp_2$ 207 at node D 225 (i.e., $V_D$) is lowered by the resistance across $R_2$ 208 as the signal traverses the feedback line 228, and thereby produces a voltage at point E 226 (i.e., $V_E$) within the feedback loop that is less than the voltage output from amplifier Amp2 207 (i.e., $V_D$ is decreased by $V_{off}$). With the decreased voltage, for example $V_E$, serving as the feedback transmission to node B 223, $V_{off}$ triggers $V_B$ to be less than $V_C$. The resistance value for $R_2$ 208 and current value for $I_1$ 209 are implemented to produce a $V_{off}$ signal that is deemed appropriate for the corresponding circuit and based on the following equations:

$$VD - VE = V_{off} \qquad (1)$$

$$I1 * R2 = V\text{off} \qquad (2)$$

$$V\text{off} > V_{off\_Amp2} \qquad (3)$$

According to an implementation, $I_1$ and $R_2$ are chosen based on the tradeoff between circuit area (e.g., resistor is large in physical size) and power. In some implementations, $R_2$ ranges from a few hundred to a few kilo ohms, and $I_1$ is from few uA to 100 uA range. In some implementations, generating a $V_{off}$ which causes $V_B$ to be slightly lower than $V_C$ will enable stable operation of the feedback loop. Thus, the circuit behavior is stabilized, such as offsetting a positive loop condition, by configuring the feedback loop portion of the peak detection circuitry 200 to implement $V_{off}$.

Figure 3:
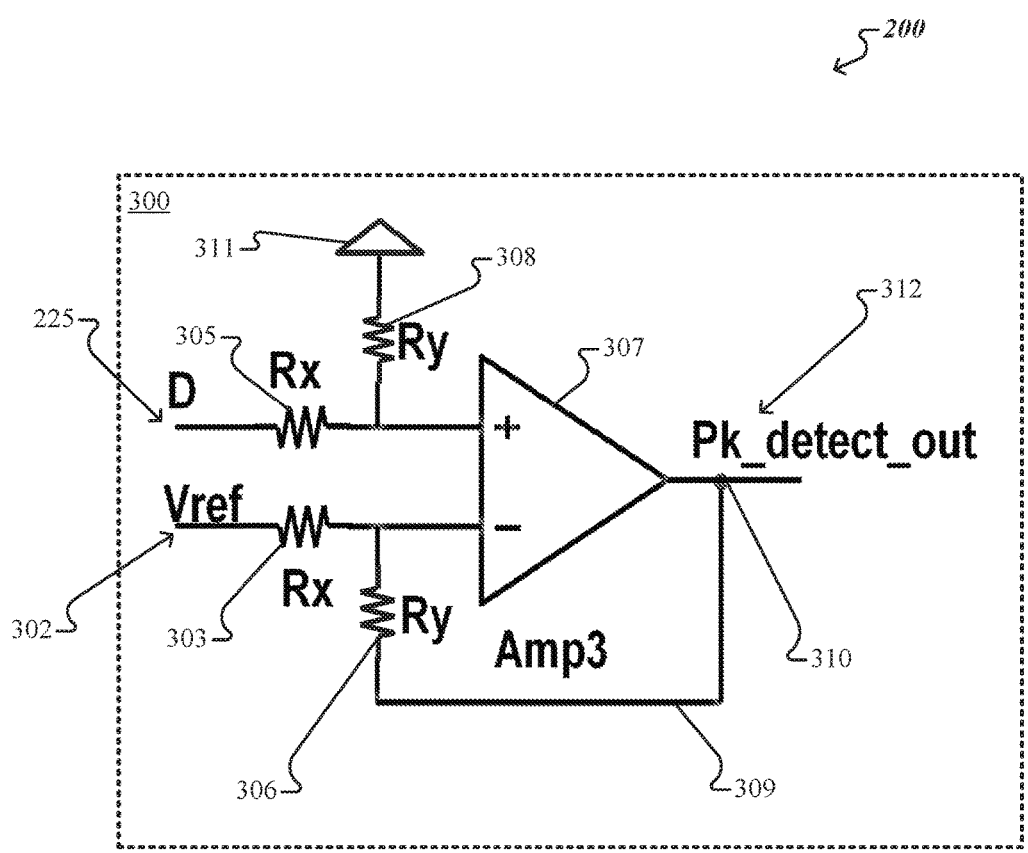
FIG. 3 shows an example of a circuit configuration for another section of peak detection circuitry as implemented in an HDD architecture, such as the HDD architecture of FIG. 1.

FIG. 3 shows an example of a circuit configuration for a second stage 300 of the peak detection circuitry 200, in accordance with an embodiment, that is suitable for implementation in an HDD architecture, such as the HDD architecture of FIG. 1. The described peak detection circuitry 200 includes components suitable to provide additional capabilities to some existing FHS, for example, by functioning to remove additional voltage signals introduced into the circuitry that may affect accuracy of the detected peak voltage level, such as a bias voltage (i.e., Vref). The second stage 300 is configured to remove $V_{ref}$ from the output signal intended to represent the peak level of a monitored voltage signal, in an embodiment. The second stage 300 is implemented as an amplifier subtractor, or difference amplifier, that enables the subtraction of two input voltages and results in a single-output differential signal $Pk_{detect\_out}$ 312. The output of the first stage (shown in FIGS. 2A-2B) is a voltage signal (i.e., $V_{pk\_dt}$) that includes the peak level (i.e., $V_{pk}$) of the input voltage signal summed with the bias voltage $V_{ref}$ added to the circuitry input for matters of performance. The voltage of the signal output $Pk_{detect\_out}$ 312 from second stage 300 (i.e., $V_{pk\_detect\_out}$) is the difference resulting from subtracting $V_{ref}$ from $V_{pk\_dt}$, and thus a more accurate representation of the peak level, $V_{pk}$ than the output of the first stage. An input terminal of resistor $R_x$ 305 receives a voltage signal from node D 225. An output terminal of amplifier $Amp_2$ (shown in FIGS. 2A-2B) is also coupled together with other components at Node D 225. Thus, node D 225 is further employed for coupling together the first stage and the second stage 300 of the peak detection circuitry 200. As illustrated in FIG. 3, the input terminal of resistor $R_x$ 303 receives the signal $V_{ref}$. The output terminals of resistors $R_x$ 303, 305 are connected to the input terminals of resistors $R_y$ 306, 308 respectively. In an implementation, the resistance value associated with $R_x$ are the same for both $R_x$ resistors 303, 305. Similarly, the resistance for $R_y$ are the same for both $R_y$ resistors 306, 308. The second stage further includes an amplifier $Amp_3$ 307. Each input terminal of the amplifier $Amp_3$ 307 is coupled together with an $R_x$, $R_y$ resistor pair. An input terminal (+) for $Amp_3$ 307 is coupled together with the output terminal of Rx 305 and the input terminal of Ry 308. $R_y$ 308 is further coupled to ground 311 by the output terminal. An additional input terminal (−) of $Amp_3$ 307 is coupled together with the output terminal of $R_x$ 303 and the output terminal of $R_y$ 306. $R_y$ 306 is further connected to the output terminal of $Amp_3$ 307, at point 310, forming a feedback loop configuration utilizing line 309 to return the output signal from $Amp_3$ 307 as feedback into the input terminal of the amplifier. In operation, the voltage signal output from stage one of the circuitry, $V_{pk\_dt}$ is present at D 225 (i.e., $V_D$) and subsequently transmitted to second stage circuitry as input into $Amp_3$ 307. The input voltage $V_D$ experiences an input impedance of $R_x$ 305 in addition to $R_y$ 308. The input voltage $V_{ref}$ 302 experiences an input impedance associated with $R_x$ 303.

By selecting the proper $R_y/R_x$ ratio a desired gain is generated, while removing $V_{ref}$ from the detection signal, which provides an output that more accurately reflects the actual peak level of the monitored signal. In some implementations, the values for Rx and Ry do not have to be exact, and implemented as a range of values. In changing the $R_y/R_x$ ratio, the detected peak is adjustable to satisfy circuitry requirements, driven by the $Amp_2$ (shown in FIGS. 2A-2b). For example, employing lower $R_x$ and $R_y$ values will increase the current flow through the circuitry making the subtractor faster with a fast reaction time (e.g., quickly performing subtraction functions) but the circuit may also consume more power. The relationship between the signals and resistance values used for removing $V_{ref}$ is represented mathematically as:

$$V_{PK\_detect\_out} = \frac{R_y}{R_x}(V_D - V_{ref}) \quad (4)$$

Thus, the peak detection circuitry as described herein employs a configuration that improves the accuracy of the peak level output of the circuitry.

Figure 4:
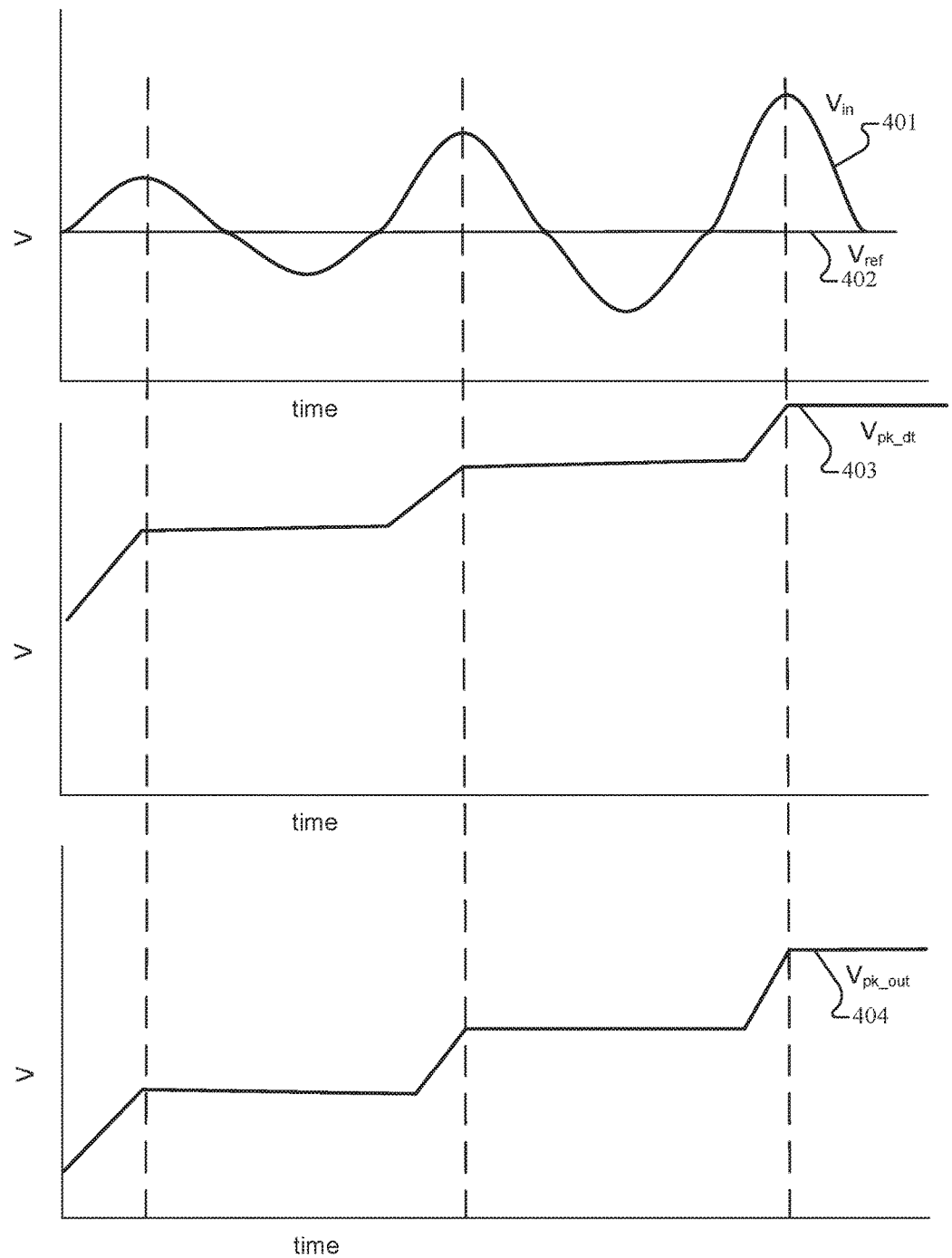
FIG. 4 shows examples of voltage peak and timing waveforms representing signals that are detectable using peak detection circuitry, such as the peak detection circuitry of FIGS. 2A-3.

FIG. 4 shows examples of voltage peak and timing waveforms. An input voltage signal $V_{in}$ 401 is graphically represented as a sinusoidal waveform displaying the changes in voltage of the monitored voltage signal during a monitoring period. As shown, the $V_{in}$ 401 waveform periodically swings above and below a constant reference voltage $V_{ref}$ 402, shown as a line at the applied reference voltage level. $V_{in}$ 401 is illustrated as having three peak levels, or maximum values, of the monitored voltage signal. Additionally, as shown, the detected peak level waveforms $V_{pk\_dt}$ 403 and $V_{pk\_out}$ 404 are examples of waveforms that can be generated from monitoring the voltage signal using the peak detection circuitry described herein, for example.

The resulting detection waveforms produced from tracking the $V_{in}$ 401 signal are the voltage peak ramp waveforms $V_{pk\_dt}$ 403 and $V_{pk\_out}$ 404. Both voltage peak ramp waveforms are shown as having three ramp intervals corresponding to the detection of each of the three voltage peak levels of $V_{in}$ 401. As an example, each ramp jumps to the successively higher voltage value, or increases in ramp wave height, at the time the peak detection circuitry operates to hold the highest detected voltage value of $V_{in}$ 401, for instance at the time of each voltage peak. Also, $V_{pk\_dt}$ 403 is illustrated in FIG. 4 as a y-axis shifted version of $V_{pk\_out}$ 404 representing the difference of the $V_{ref}$ 402 voltage. The $V_{pk\_dt}$ 403 ramp waveform is higher along the y-axis at a vertical difference equal to the $V_{ref}$ 402 voltage, as the reference voltage is included in the initially detected peak voltage signal $V_{pk\_dt}$ 403, but subsequently removed by the peak detection circuitry to generate the output signal $V_{pk\_out}$ 404. Each of the waveforms $V_{in}$ 401, $V_{pk\_dt}$ 403, and $V_{pk\_out}$ 404 are plotted as voltage (y axis) versus time (x axis). In some instances, the peak voltage is kept by the peak detection circuitry for extended periods of time, as the leakage experienced in the circuit is significantly reduced. In an operational environment, the waveforms represented in FIG. 4 (i.e., $V_{ref}$ 402 and $V_{pk\_dt}$ 403) eventually return back to zero at the point where there is no more signal coming into the circuitry. As an example of a real application in HDD system, for instance, once the peak voltage is being detected, a customer may tune the gain based on the peak information. After each gain tuning, the peak detector will also get reset to recapture the peak, and there will be a break in an input voltage signal.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including system on chip (SoC) implementations, which can include one or more controllers and embedded code.

While this specification contains many specifics, these should not be construed as limitations on the scope of what may be claimed, but rather as descriptions of features that may be specific to particular implementations. Certain features that are described in this specification in the context of separate implementations can also be configured in combination in a single implementation. Conversely, various features that are described in the context of a single implementation can also be configured in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results.

Other implementations fall within the scope of the following claims.

What is claimed is:

1. An integrated circuit device comprising:
    peak detection circuitry configured to receive a voltage signal and output a peak voltage signal associated with a peak voltage level of the voltage signal, wherein the peak detection circuitry comprises:
        a linear loop section configured to store the peak voltage level and hold additional voltage levels of the voltage signal at an output terminal of an amplifier to a value greater than zero; and
        a feedback loop section configured to reduce a leakage current within the peak detection circuitry and generate a guard voltage signal usable to reduce a feedback voltage and prevent the feedback voltage from successively re-entering into the feedback loop section.

2. The integrated circuit device of claim 1, wherein the linear loop section includes (i) a transistor, (ii) a first diode, (iii) the amplifier, wherein the amplifier is a first amplifier and a first input terminal of the first amplifier is configured to receive the voltage signal, and the output terminal of the first amplifier is coupled together with an input terminal of the first diode and an emitter terminal of the transistor, (iv) a second diode, wherein an input terminal of the second diode is coupled together with an output terminal of the first diode and a first end of a feedback line and the feedback voltage is a voltage level at the input terminal of the second diode, (iv) a capacitor coupled between an output terminal of the second diode and ground, wherein the capacitor is configured to store the peak voltage level, and (v) a loop line, wherein a first end of the loop line is coupled with a second input terminal of the first amplifier and a second end of the loop line is coupled with the output terminal of the second diode, wherein the capacitor is coupled with the loop line; and
    the feedback loop section includes (i) a second amplifier, wherein an input terminal of the second amplifier is coupled together with the output terminal of the second diode and the capacitor, and an output terminal of the second amplifier is coupled with a second end of the feedback line, (ii) a first resistor coupled between the output terminal of the second amplifier and the second end of the feedback line, wherein the first resistor and the feedback line are configured to generate the guard voltage signal at an output terminal of the first resistor, (iii) a second resistor coupled to the feedback line, wherein an output terminal of the second resistor is coupled with the input terminal of the second diode, wherein the second resistor and the feedback line are configured to reduce the leakage current associated with the output terminal of the second diode.

3. The integrated circuit device of claim 2, wherein the loop line is arranged to couple a terminal of the capacitor and the emitter terminal of the transistor with the first diode, the second diode, and the first amplifier coupled in a loop configuration.

4. The integrated circuit device of claim 2, wherein the feedback line couples the second diode, the second amplifier, the first resistor, and the second resistor in a feedback loop configuration.

5. The integrated circuit device of claim 4, wherein the second resistor is coupled in parallel with the second amplifier and the second diode.

6. The integrated circuit device of claim 4, comprising a current source coupled between the feedback loop and ground.

7. The integrated circuit device of claim 2, wherein the output terminal of the second amplifier is configured to output the peak voltage signal, wherein the peak voltage signal includes a reference voltage signal.

8. The integrated circuit device of claim 7, wherein the output terminal of the second amplifier is coupled with subtractor circuitry used to remove the reference voltage signal from the peak voltage signal.

9. The integrated circuit device of claim 8, wherein the subtractor circuitry comprises:
    a third amplifier;
    a third resistor coupled between a first input terminal of the third amplifier and ground;
    a fourth resistor coupled together with the first input terminal of the third amplifier and the third resistor;
    a fifth resistor coupled between a second input terminal of the third amplifier and an output terminal of the third amplifier; and
    a sixth resistor coupled together with the second input terminal of the third amplifier and the fifth resistor and configured to receive the reference voltage signal.

10. The integrated circuit device of claim 9, wherein the output terminal of the third amplifier is configured to provide an output signal produced by removing the reference voltage signal from the peak voltage signal.

11. The integrated circuit device of claim 2, wherein the transistor is a bipolar junction transistor (BJT).

12. A hard disk drive (HDD) system comprising:
    a disk;
    a read/write head; and
    an integrated circuit device, wherein the integrated circuit device comprises sensor circuitry, signal analysis circuitry, and peak detection circuitry providing (i) a receiving path coupling the sensor circuitry to the peak detection circuitry and usable to receive a voltage signal generated by the sensor circuitry in response to movement of the disk and the read/write head, and (ii) an output path coupling the peak detection circuitry to the signal analysis circuitry and usable to output an output signal indicating a peak voltage level of the voltage signal to the signal analysis circuitry;

wherein the receiving path is configured to hold additional voltage levels of the voltage signal at an output terminal of an amplifier to a value greater than zero, reduce a leakage current within the peak detection circuitry, and generate a guard voltage signal usable to reduce a feedback voltage and prevent the feedback voltage from successively re-entering into the receiving path.

13. The HDD system of claim 12, wherein the receiving path comprises: (i) a transistor, (ii) a first diode, (iii) a first amplifier, wherein a first input terminal of the first amplifier is configured to receive the voltage signal, and an output terminal of the first amplifier is coupled together with an input terminal of the first diode and an emitter terminal of the transistor, (iv) a second diode, wherein an input terminal of the second diode is coupled together with an output terminal of the first diode and a first end of a feedback line a second amplifier, (v) a capacitor coupled between an output terminal of the second diode and ground, (vi) a second amplifier, wherein an input terminal of the second amplifier is coupled together with the output terminal of the second diode and the capacitor, and an output terminal of the second amplifier is coupled with a second end of the feedback line, (vii) a first resistor coupled between the output terminal of the second amplifier and the second end of the feedback line, (viii) a second resistor coupled to the feedback line, wherein the output terminal of the second resistor is coupled with the input terminal of the second diode, and (ix) a loop line, wherein a first end of the loop line is coupled with a second input terminal of the first amplifier and a second end of the loop line is coupled with the output terminal of the second diode, wherein the capacitor is coupled with the loop line; and wherein the output path is coupled to a transmission path and comprises: (i) a third amplifier, (ii) a third resistor coupled between a first input terminal of the third amplifier and ground, (iii) a fourth resistor coupled together with the first input terminal of the third amplifier and the third resistor, (iv) a fifth resistor coupled between a second input terminal of the third amplifier and an output terminal of the third amplifier, and a (v) sixth resistor coupled together with the second input terminal of the third amplifier and the fifth resistor and configured to receive a reference voltage signal, and is usable to remove the reference voltage signal from the output signal.

14. The HDD system of claim 13, wherein the movement of the disk and the read/write head is associated with a flying height distance and the signal analysis circuitry determines the flying height distance based on the output signal.

15. The HDD system of claim 13, wherein the wherein the transistor is a bipolar junction transistor (BJT).

16. The HDD system of claim 15, wherein the transmission path further comprises a current source coupled with the first resistor to generate an offset voltage on the transmission path.

17. A method comprising:
receiving an input voltage signal at an in input terminal of a first amplifier, wherein the first amplifier is coupled to a receiving path including (i) a transistor, (ii) a first diode, (iii) a second diode, (ix) a first resistor, (v) a second resistor, (vi) a loop line, and (vii) a feedback line;
propagating a first voltage signal along the receiving path from an output terminal of the first amplifier to a terminal of a capacitor and returning the first voltage signal to an additional input terminal of the first amplifier, wherein the receiving path is enabled based on the first voltage signal applying a forward bias voltage across the first diode and the second diode and the propagating the first voltage signal comprises holding a peak voltage level associated with the input voltage signal at the capacitor and propagating the first voltage signal via a loop line coupling the capacitor, the transistor, the first diode, the second diode, and the first amplifier in a loop configuration and holding additional voltage levels associated with the input voltage signal at the output terminal of the first amplifier to a value greater than zero;
propagating a second voltage signal along the receiving path from an output terminal of the second diode to an input terminal of a second amplifier;
propagating a third voltage signal along the receiving path from an output terminal of the second amplifier to an input terminal of a first resistor and returning the third voltage signal to an input terminal of the second diode via the feedback line, wherein the propagating the third voltage signal comprises propagating across the first resistor and reducing a voltage level of the third voltage signal such that a feedback voltage level at an input terminal of the second diode is less than a voltage level of the second voltage signal; and
outputting a fourth voltage signal from an output terminal of the second amplifier to be received by an output path, wherein the fourth voltage signal is a portion of the third voltage signal and is associated with the peak voltage level.

18. The method of claim 17, wherein the input voltage signal is a sum of a reference voltage and a signal voltage, and the reference voltage is a direct current (DC) bias voltage.

19. The method of claim 17, wherein reducing the voltage level of the third voltage signal comprises generating a guard voltage along the feedback line using the first resistor and a current source coupled to the feedback line, and reducing the voltage level of the third voltage signal by the guard voltage.

20. The method of claim 17, wherein the propagating the third voltage signal further comprises propagating the third voltage signal via a feedback line coupling the second diode, the first resistor, the second amplifier, and the second resistor in a feedback loop configuration.

21. The method of claim 17, comprising propagating the fourth voltage signal along the output path, wherein the output path comprises: (i) a third amplifier, (ii) a third resistor, (iii) a fourth resistor, (iv) a fifth resistor, and a (v) sixth resistor.

22. The method of claim 19, wherein propagating the fourth voltage signal along the output path comprises removing a reference voltage from the fourth voltage signal.

* * * * *